United States Patent [19]
Gardner

[11] Patent Number: 6,020,260
[45] Date of Patent: Feb. 1, 2000

[54] METHOD OF FABRICATING A SEMICONDUCTOR DEVICE HAVING NITROGEN-BEARING GATE ELECTRODE

[75] Inventor: Mark I. Gardner, Cedar Creek, Tex.

[73] Assignee: Advanced Micro Devices, Inc., Sunnyvale, Calif.

[21] Appl. No.: 08/882,424

[22] Filed: Jun. 25, 1997

[51] Int. Cl.[7] .................................................. H01L 21/44
[52] U.S. Cl. ........................ 438/657; 438/588; 438/653
[58] Field of Search .................................... 438/762, 588, 438/593, 594, 398, 525, 532, 653, 657; 257/336, 344, 300

[56] References Cited

U.S. PATENT DOCUMENTS

| | | | |
|---|---|---|---|
| 5,266,816 | 11/1993 | Seto et al. .................................. | 257/65 |
| 5,407,870 | 4/1995 | Okada et al. ............................ | 437/241 |
| 5,427,976 | 6/1995 | Koh et al. ................................ | 438/158 |
| 5,554,871 | 9/1996 | Yamashita et al. ...................... | 257/336 |
| 5,597,754 | 1/1997 | Lou et al. ................................. | 437/52 |
| 5,837,598 | 11/1998 | Aronowitz et al. ..................... | 438/532 |

OTHER PUBLICATIONS

Kuroi, Novel NICE (Nitrogen Implatation into CMOS Gate Electrode and Source–Drain) Structure for High Reliability and High performance 0.25 micrometers Dual Gate CMOS, IEEE, 13.2.1–13.2.4, 1993.

*Primary Examiner*—Charles Bowers
*Assistant Examiner*—Reneé R. Berry

[57] ABSTRACT

A semiconductor device having a nitrogen-bearing gate electrode and method of fabricating the same is provided. Consistent with the invention, a semiconductor device is formed by forming a gate oxide layer on a surface of a substrate. Over the gate oxide layer is formed a lower polysilicon layer with a first nitrogen concentration. Over the lower polysilicon layer, there is formed an upper polysilicon layer with a second nitrogen concentration less than the first nitrogen concentration. The two polysilicon layers are used to form at least one gate electrode.

32 Claims, 2 Drawing Sheets

METHOD OF FABRICATING A SEMICONDUCTOR DEVICE HAVING NITROGEN-BEARING GATE ELECTRODE

FIELD OF THE INVENTION

The present invention is directed generally to semiconductor devices and, more particularly, to a semiconductor device having a nitrogen-bearing gate electrode and a process for fabricating such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modern electronic circuits.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily doped source/drain regions 105 are formed within the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.).

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate electrode. The gate electrode is typically formed by first depositing, usually through chemical vapor deposition (CVD), a layer of polysilicon over the entire substrate. The polysilicon layer is then doped, for example, by implantation or diffusion, with an appropriate type dopant. Next the gate electrode is patterned using a mask and the polysilicon layer is etched, typically through a dry etch process, to form the gate electrode.

The above described conventional techniques for forming gate electrodes impose limitations on the performance of present semiconductor devices. For example, these conventional techniques often result in a deleterious current, that flows across the channel when the gate voltage is below the threshold voltage. This off-state or subthreshold current significantly impacts device performance and limits the ability to scale down semiconductor devices. In short channel devices (channel lengths <0.3 $\mu$m), subthreshold current becomes even more pronounced and hinders the ability to further scale down semiconductor devices.

SUMMARY OF THE INVENTION

Generally, the present invention relates to a semiconductor device having a nitrogen-bearing gate electrode and method of fabricating the same. Consistent with the invention, a semiconductor device is formed by forming a gate oxide layer on a surface of a substrate. Over the gate oxide layer is formed a lower polysilicon layer with a first nitrogen concentration. Over the lower polysilicon layer, there is formed an upper polysilicon layer with a second nitrogen concentration less than the first nitrogen concentration. The two polysilicon layers are used to form at least one gate electrode. The presence of nitrogen in the gate electrode generally enhances the performance of the semiconductor device.

In accordance with one particular embodiment of the invention, the lower polysilicon layer is formed by depositing a layer of polysilicon in an amorphous state and annealing the amorphous polysilicon layer in a nitrogen-bearing ambient. The relatively uncrystallized amorphous state of the lower polysilicon layer serves to facilitate incorporation of nitrogen in the gate electrode.

One semiconductor device in accordance with an embodiment of the invention includes a substrate and at least one gate electrode including nitrogen disposed over the substrate. The gate electrode includes a lower polysilicon portion near the substrate and an upper polysilicon portion disposed over the lower polysilicon portion. The lower polysilicon portion has a larger grain size than the upper polysilicon portion.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
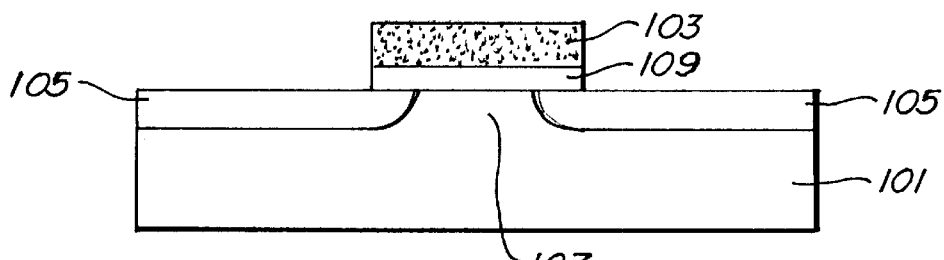
FIG. 1 illustrates an exemplary MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention generally provides a semiconductor device having a nitrogen-bearing gate electrode and a method for fabricating such a device. The present invention is applicable to a number of semiconductor devices including, for example, MOS and CMOS transistors. While the present invention is not limited to such devices, an appreciation of various aspects of the invention will be gained through a discussion of various fabrication processes and device characteristics in connection with the examples provided below.

With reference to FIGS. 2A through 2E, a process for fabricating a MOS semiconductor device in accordance with one particular embodiment of the present invention will be described. The semiconductor device generally includes a substrate 201. The substrate is typically formed of silicon and may, for example, include n-channel regions where NMOS devices are formed and/or p-channel regions where PMOS devices are formed.

Figure 2A:
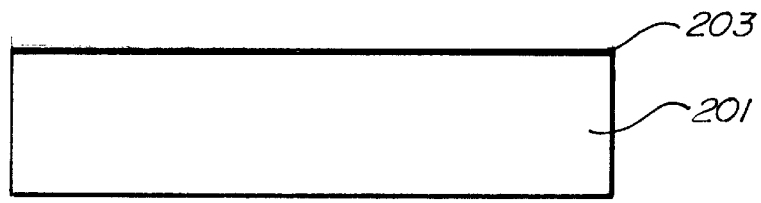
FIGS. 2A–2E illustrate an exemplary process in accordance with another embodiment of the invention.

In FIG. 2A, a gate oxide layer 203 is formed over the silicon substrate 201. The gate oxide layer 203 may, for example, be a silicon dioxide or a nitrogen bearing oxide, grown over the substrate 201 using well-known techniques. For example, a nitrogen bearing oxide may be formed over the substrate 201 by growing the gate oxide layer 203 in an ambient of a nitrogen containing species, such as NO and/or $N_2O$. The gate oxide layer 203 is typically a relatively thin layer having a thickness typically selected in consideration of device reliability. By way of example, suitable thicknesses of the gate oxide layer 203 range from about 10 to 60 Angstroms (Å).

Figure 2B:
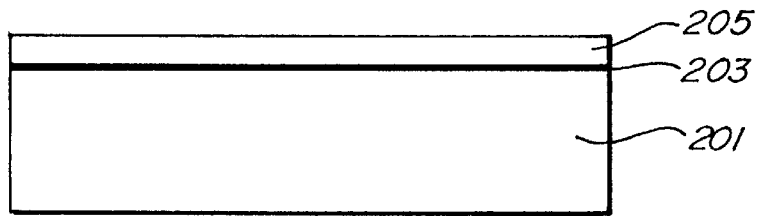

A lower polysilicon layer 205 is formed over the gate oxide layer 203. The resultant structure is illustrated in FIG. 2B. The lower polysilicon layer 205 may be formed using, for example, well-known chemical vapor deposition (CVD) techniques. In one particular embodiment, the lower polysilicon layer 205 is deposited in an amorphous state, usually at a temperature ranging from about 550° to 580° C., using a CVD technique. Forming the lower polysilicon layer 205 in an amorphous state generally provides a polysilicon film having an relatively large grain size and relatively little crystalline structure. Grain sizes on the order of 0.1 to 0.2 microns are typically formed. The large grain size and amorphous structure of the lower polysilicon layer 205 generally facilitate the incorporation of nitrogen in the lower polysilicon layer and, in particular, facilitate incorporation of nitrogen at the polysilicon-gate oxide interface, as will be discussed more fully below.

As will also be discussed below, the lower polysilicon layer 205 will be subject to heat treatment in a nitrogen-bearing ambient in order to incorporate nitrogen therein. The thickness of the lower polysilicon layer 205 may be suitably selected in consideration of the heat treatment so that a suitable amount of nitrogen is incorporated at the polysilicon-gate oxide interface without subjecting the polysilicon layer to excessive heat. Suitable thicknesses for the lower polysilicon layer 205 range from about 100 to 400 Å for many applications.

Figure 2C:
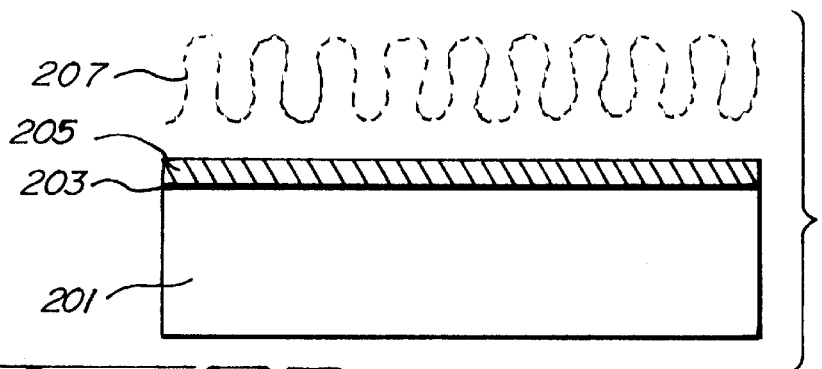

The lower polysilicon layer 205 is subject to heat treatment in a nitrogen-bearing ambient 207, as indicated in FIG. 2C. During this heat treatment, nitrogen generally defuses into the lower polysilicon layer 205 and may accumulate at the polysilicon-gate oxide interface. Where the lower polysilicon layer 205 is formed from in a relatively amorphous state, nitrogen diffuses into the polysilicon more readily than it would in single crystal state polysilicon. This allows for the use of shorter heat treatment, for example. As will be appreciated, in addition to incorporating nitrogen, the heating of the lower polysilicon layer 205 generally will cause the grain size of the polysilicon layer to increase and the polysilicon to crystallize. One exemplary heat treatment includes annealing the lower polysilicon layer 205 in a nitrogen-ambient using, for example, a rapid thermal anneal (RTA) tube. The annealing may, for example, be performed at temperatures ranging from about 900 to 1150° C.

The nitrogen-bearing ambient 207 generally includes one or more nitrogen-bearing species, such as $N_2$, $NH_3$, or $NF_3$, for example. While other substances may be included in the nitrogen-bearing ambient, oxygen is typically avoided. A sufficiently high concentration of oxygen may result in the formation of oxide layer, which, if not removed, would become sealed between the lower polysilicon layer 205 and a second polysilicon layer (discussed below). A sealed oxide layer within a gate electrode would undesirably affect the performance of the transistor. An additional oxide removal step, however, could be performed if such an oxide layer is formed.

The concentration of nitrogen in the nitrogen-bearing ambient 207 may be suitably selected in consideration of the desired nitrogen concentration of the lower polysilicon layer 205. The nitrogen concentration of the lower polysilicon layer 205 is typically selected to enhance device properties without substantially affecting the use of the polysilicon as a conductive gate electrode. Concentrations of nitrogen in the lower polysilicon layer 205 ranging from about 5 to 10% would be suitable for many applications.

The nitrogen concentration profile of the lower polysilicon layer 205 after the heat treatment can vary, for example, with the length of the heat treatment, the concentration of nitrogen in the ambient 209, and the depth of the lower polysilicon layer 205. In general, the nitrogen concentration profile will have a peak at the upper surface of the lower polysilicon layer 205 and will gradually decrease with depth. At the polysilicon-gate oxide interface, nitrogen will accumulate. The accumulation of nitrogen at this interface may occur during the heat treatment in FIG. 2C and/or during subsequent heat treatments.

Figure 2D:
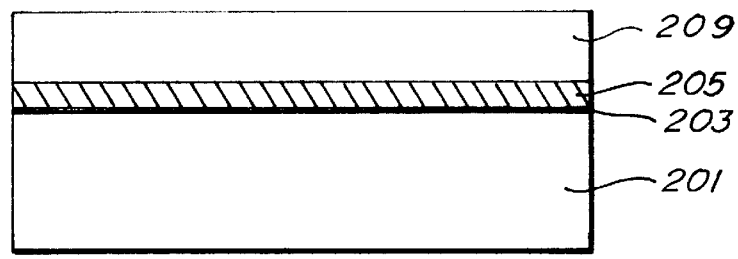

Following the nitrogen-bearing ambient heating, a second, upper polysilicon layer 209 is formed over the lower polysilicon layer 205. The resultant structure is depicted in FIG. 2D. The upper polysilicon layer 209 may be formed using, for example, well-known CVD deposition techniques. Typically, the upper polysilicon layer is deposited in a single crystal state, usually at temperatures over 580° C. The invention, however, is not so limited. The upper polysilicon layer 209 may, for example, be deposited in an amorphous state as well. Single crystal poly deposition provides a relatively greater throughput than amorphous deposition. In addition, single crystal poly deposition generally results in smaller grain sizes, typically ranging from about 0.5 to 1 microns, and a relatively crystallized structure. Accordingly, single crystal state polysilicon will absorb nitrogen at a slower rate. This may be desirable where less nitrogen is desired in the upper polysilicon layer 209.

The thickness of the upper polysilicon layer 209 may be suitably selected in consideration of the desired overall depth of the polysilicon layers. Thicknesses of the upper polysilicon layer 209 ranging from about 500 to 1500 Å would be suitable for many applications.

Figure 2E:
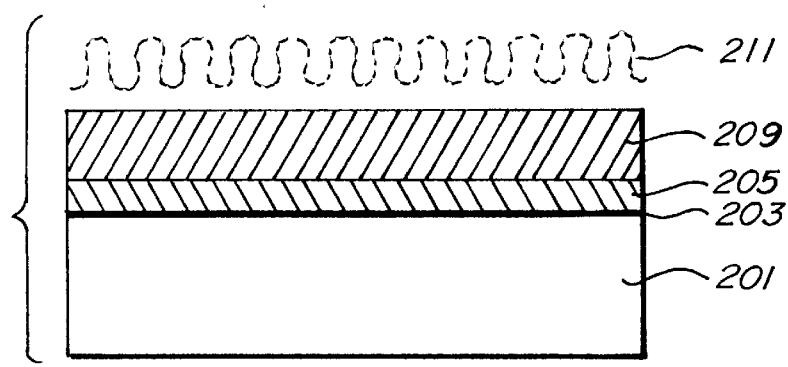

The structure of FIG. 2D may then be heated in a second nitrogen-bearing ambient 211, as illustrated in FIG. 2E. The heating may include, for example, a rapid thermal anneal at temperatures ranging from 900 to 1150° C. During this heat treatment, nitrogen is incorporated in the upper polysilicon layer 209 via diffusion from the nitrogen-bearing ambient 211 as well as from the lower polysilicon layer 205. In addition, the nitrogen in the lower polysilicon layer 205 continues to diffuse downwardly and accumulate at the polysilicon-gate oxide interface. Characteristics of the heat treatment and the nitrogen-bearing ambient may be suitably selected in consideration of the desired concentration of nitrogen in the upper polysilicon layer 209. Suitable nitrogen concentrations in the upper polysilicon layer 209 range from 2 to 4% for many applications.

The nitrogen-bearing ambient 211 generally includes a nitrogen-bearing species, which may include both nitrogen and oxygen. Suitable nitrogen-bearing species include, for example, NO and $N_2O$. Incorporation of oxygen in the nitrogen-bearing ambient generally slows the rate of nitrogen incorporation into the upper polysilicon layer and allows greater control over such diffusion. Moreover, any oxide formed on the surface of the upper polysilicon layer may be removed in subsequent processing using, for example, chemical or wet etching techniques.

Fabrication may continue with well-known fabrication steps in order to complete the device structure. For example, the polysilicon layers 205 and 209 may be etched to form one or more gate electrodes, regions of the substrate adjacent the gate electrodes may be doped to form source/drain regions, and so forth. It should be appreciated that during these fabrication steps, the polysilicon layers may be subject to further heating, thus further diffusing the nitrogen therein. If desired, additional heating steps may be performed to adjust the nitrogen profile and accumulate nitrogen at the polysilicon-gate oxide interface, as desired. An exemplary gate electrode formed in accordance with one embodiment of the invention is illustrated in FIG. 3 and will be discussed below.

Using the above process, nitrogen can be incorporated at the polysilicon-gate oxide interface. This generally improves the reliability and characteristics of the ultimately produced semiconductor device. For example, nitrogen at the gate electrode-gate oxide of a semiconductor MOS device serves to inhibit the dopant in the gate electrode (e.g., boron atoms in a PMOS device or arsenic or phosphorus atoms in an NMOS device) from diffusing through the gate oxide layer and into the channel region. The improved reliability and characteristics are typically more apparent in PMOS devices than in NMOS devices as p-type dopants, such as boron, are more prone to penetrating the gate oxide layer.

Additionally, by using a multiple polysilicon deposition for incorporating nitrogen into the resulting gate electrode, enhanced control over the nitrogen incorporation can be achieved. For example, using the multiple polysilicon deposition, an increased concentration of nitrogen may advantageously be incorporated in a lower portion of the gate electrode than in the upper portion of the gate electrode. Furthermore, by depositing a lower amorphous polysilicon layer, nitrogen may be provided in a gate electrode without subjecting the polysilicon gate electrode to excessive heat.

Figure 3:
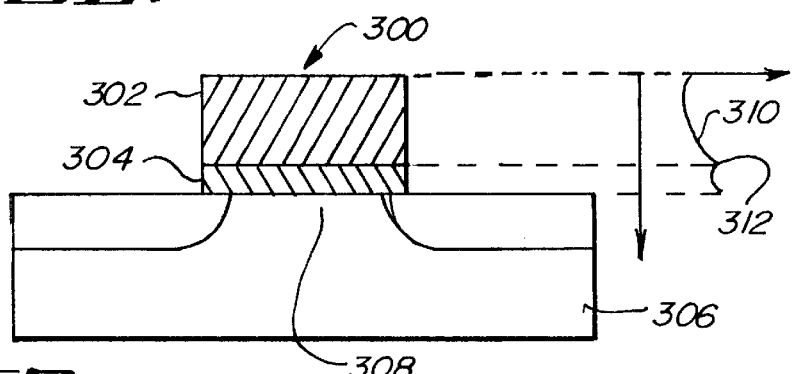
FIG. 3 illustrates an exemplary gate electrode formed in accordance with an embodiment of the invention.

Turning now to FIG. 3, there is illustrates an exemplary gate electrode formed in accordance with one embodiment of the invention. The gate electrode 300 generally includes an upper polysilicon portion 302 and a lower polysilicon portion 304. The gate electrode 300 is typically separated from the underlying substrate 306 by a thin gate oxide layer 308. The upper polysilicon portion 302 generally includes a lower amount of nitrogen than the lower polysilicon portion 304. An exemplary nitrogen concentration profile 310 is illustrated to the right of the gate electrode 300. As can be seen from the nitrogen concentration profile 310, the concentration of nitrogen includes a peak 312 at the interface between the upper and lower polysilicon portions 302 and 304 resulting from the nitrogen-ambient heat treatment of the lower polysilicon portion 304. The lower polysilicon portion 304 may further include larger grain sizes that the upper polysilicon portion 302, where the lower polysilicon portion 304 is deposited in an amorphous state.

In alternate embodiments, the second nitrogen-bearing ambient heating may be omitted. For example, the second nitrogen-bearing ambient heating may be replaced by a non-nitrogen bearing ambient heating step or subsequent heating steps in device formation may be relied upon to further diffuse the nitrogen in the lower polysilicon layer. These alternate embodiments still allow incorporation of nitrogen at the polysilicon-gate oxide interface (via the lower polysilicon layer) and provide a suitable concentration of nitrogen at this interface in order to enhance device performance. It should also be appreciated that in these alternate embodiments, some amount of nitrogen will be incorporated into the upper polysilicon layer as a result of diffusion of the nitrogen from the lower polysilicon layer.

As noted above, the present invention provides a semiconductor device and a method of fabricating a semiconductor device having a nitrogen-bearing gate electrode. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A process of forming a semiconductor device, comprising:

forming a thin oxide layer on a surface of a substrate;

forming a lower polysilicon layer with a first nitrogen concentration over the thin oxide layer;

forming a upper polysilicon layer with a second nitrogen concentration over the lower polysilicon layer, wherein the first nitrogen concentration differs from the second nitrogen concentration; and removing a portion of the lower and upper polysilicon layers to form at least one gate electrode.

2. The process of claim 1, wherein forming the lower polysilicon layer includes:

forming a first polysilicon layer on the gate oxide layer; and heating the first polysilicon layer in a nitrogen-bearing ambient to form the lower polysilicon layer.

3. The process of claim 2, wherein the first polysilicon layer is deposited in an amorphous state.

4. The process of claim 2, wherein the nitrogen-bearing ambient includes $NH_3$.

5. The process of claim 2, wherein the nitrogen-bearing ambient includes $N_2$.

6. The process of claim 2, wherein the nitrogen-bearing ambient includes $NH_3$ and $N_2$.

7. The process of claim 2, wherein the first polysilicon layer is heated at temperatures ranging from about 900 to 1150° C.

8. The process of claim 1, wherein forming the upper polysilicon layer includes forming a second polysilicon layer on the lower polysilicon layer.

9. The process of claim 8, wherein the second polysilicon layer is deposited in an amorphous state.

10. The process of claim 8, wherein the second polysilicon layer is deposited in an single crystal state.

11. The process of claim 8, wherein forming the upper polysilicon layer further includes heating the second polysilicon layer in a nitrogen-bearing ambient.

12. The process of claim 11, wherein the nitrogen-bearing ambient includes oxygen.

13. The process of claim 12, wherein the nitrogen-bearing ambient includes $N_2O$.

14. The process of claim 12, wherein the nitrogen-bearing ambient includes NO.

15. The process of claim 8, wherein the second polysilicon layer is heated at temperatures ranging from about 900 to 1150° C.

16. The process of claim 1, wherein the first nitrogen concentration ranges from about 5–10%.

17. The process of claim 16, wherein the second nitrogen concentration ranges from about 2–4%.

18. The process of claim 1, wherein the lower polysilicon layer has a thickness less than the thickness of the upper polysilicon layer.

19. The process of claim 18, wherein the lower polysilicon layer has a thickness ranging from about 100 to 400 Å.

20. The process of claim 18, wherein the upper polysilicon layer has a thickness ranging from about 500 to 1500 Å.

21. A process of forming a semiconductor device, comprising:

forming a thin oxide layer on a surface of a substrate;

depositing a lower polysilicon layer in an amorphous state over the thin oxide layer;

annealing the lower polysilicon layer in a first nitrogen bearing ambient to incorporate nitrogen in the lower polysilicon layer;

depositing a upper polysilicon layer over the lower polysilicon layer;

annealing the upper polysilicon layer in a second nitrogen bearing ambient to incorporate nitrogen in the upper polysilicon layer; and removing a portion of the lower and upper polysilicon layers to form at least one gate electrode;

wherein the nitrogen in the lower polysilicon layer has a higher concentration than the nitrogen in the upper polysilicon layer.

22. The process of claim 21, wherein the lower polysilicon layer has a thickness less than the thickness of the upper polysilicon layer.

23. The process of claim 22, wherein the lower polysilicon layer has a thickness ranging from about 100 to 400 Å.

24. The process of claim 23, wherein the upper polysilicon layer has a thickness ranging from about 500 to 1500 Å.

25. A process of forming one or more gate electrodes on a semiconductor substrate, comprising:

forming a lower polysilicon layer with a first nitrogen concentration over a gate dielectric layer; and forming an upper polysilicon layer, having a second nitrogen concentration different than the first concentration of nitrogen, over the lower polysilicon layer; and using the upper and lower polysilicon layers to form the one or more gate electrodes.

26. The process of claim 25, wherein forming the lower polysilicon layer includes:

forming a first polysilicon layer over the gate dielectric layer; and heating the first polysilicon layer in a nitrogen-bearing ambient to form the lower polysilicon layer.

27. The process of claim 26, wherein forming the upper polysilicon layer includes:

forming a second polysilicon layer on the lower polysilicon layer; and heating the second polysilicon layer in a nitrogen-bearing ambient to form the upper polysilicon layer.

28. The process of claim 25, wherein the first nitrogen concentration ranges from about 5–10%.

29. The process of claim 27, wherein the second nitrogen concentration ranges from about 2–4%.

30. The process of claim 25, wherein the lower polysilicon layer has a thickness less than a thickness of the upper polysilicon layer.

31. The process of forming one or more electrodes on a semiconductor substrate, comprising:

forming a gate dielectric layer over the substrate;

depositing a lower polysilicon layer over the gate dielectric layer;

heating the lower polysilicon layer to provide the lower polysilicon with a first nitrogen concentration;

depositing the upper polysilicon layer over the lower polysilicon layer after heating the lower polysilicon layer;

heating the upper polysilicon layer in a nitrogen-bearing ambient to provide the upper polysilicon layer with a second nitrogen concentration different than the first nitrogen concentration;

selectively removing portions of the upper and lower polysilicon layers to form one or more gate electrodes over the substrate; and doping regions of the substrate adjacent the one or more gate electrodes to form source/drain regions.

32. The process of claim 31, wherein the lower polysilicon layer has a thickness less then the thickness of the upper polysilicon layer.

* * * * *

UNITED STATES PATENT AND TRADEMARK OFFICE
CERTIFICATE OF CORRECTION

PATENT NO. : 6,020,260

DATED : February 1, 2000

INVENTOR(S) : Mark I. Gardner

It is certified that error appears in the above-identified patent and that said Letters Patent is hereby corrected as shown below:

Col. 4, line 3: "defuses" should read --diffuses--.

Col. 8, line 1: "23" should read --22--.

Signed and Sealed this

Thirteenth Day of February, 2001

*Attest:*

NICHOLAS P. GODICI

*Attesting Officer*   *Acting Director of the United States Patent and Trademark Office*